United States Patent
Kawasaki et al.

(10) Patent No.: US 10,424,428 B2
(45) Date of Patent: Sep. 24, 2019

(54) SUPER-CONDUCTING WIRE, SUPER-CONDUCTING COIL, AND MAGNETIC RESONANCE IMAGING DEVICE

(71) Applicant: HITACHI, LTD., Tokyo (JP)

(72) Inventors: Masahiro Kawasaki, Tokyo (JP); Kenji Okishiro, Tokyo (JP); Tadashi Arai, Tokyo (JP); Akihisa Miyazoe, Tokyo (JP)

(73) Assignee: HITACHI, LTD., Tokyo (JP)

( * ) Notice: Subject to any disclaimer, the term of this patent is extended or adjusted under 35 U.S.C. 154(b) by 334 days.

(21) Appl. No.: 15/310,802

(22) PCT Filed: Jun. 17, 2015

(86) PCT No.: PCT/JP2015/067384
§ 371 (c)(1),
(2) Date: Nov. 14, 2016

(87) PCT Pub. No.: WO2015/194576
PCT Pub. Date: Dec. 23, 2015

(65) Prior Publication Data
US 2017/0092397 A1     Mar. 30, 2017

(30) Foreign Application Priority Data
Jun. 18, 2014    (JP) ................................ 2014-124890

(51) Int. Cl.
| | |
|---|---|
| *G01V 3/00* | (2006.01) |
| *H01F 6/06* | (2006.01) |
| *G01R 33/38* | (2006.01) |
| *G01R 33/3815* | (2006.01) |

(Continued)

(52) U.S. Cl.
CPC ........... *H01F 6/06* (2013.01); *G01R 33/3802* (2013.01); *G01R 33/3815* (2013.01); *H01F 5/02* (2013.01);
(Continued)

(58) Field of Classification Search
CPC ............ G01R 33/4816; G01R 33/4818; G01R 33/482; G01R 33/4822; G01R 33/4824;
(Continued)

(56) References Cited

U.S. PATENT DOCUMENTS

2016/0307662 A1\* 10/2016 Ikeda ..................... H01B 3/306
2016/0307668 A1\* 10/2016 Oya .......................... H01F 5/06
(Continued)

FOREIGN PATENT DOCUMENTS

| | | |
|---|---|---|
| JP | 07-094318 A | 4/1995 |
| JP | 07-192912 A | 7/1995 |

(Continued)

*Primary Examiner* — Huy Q Phan
*Assistant Examiner* — Raul J Rios Russo
(74) *Attorney, Agent, or Firm* — Volpe and Koenig, P.C.

(57) ABSTRACT

An object is to provide a super-conducting coil and a magnetic resonance imaging device that are quench-free by reducing Joule heat generated upon occurrence of separation of members even in a high magnetic field. The super-conducting coil in accordance with the present invention includes a spool and a super-conducting wire wound around the spool. The coil further includes, between the spool and the super-conducting wire, a first resin layer containing thermoplastic resin, a second resin layer containing thermosetting resin, and a mixed layer, the mixed layer being positioned between the first resin layer and the second resin layer and containing a mixture of the thermoplastic resin and the thermosetting resin.

17 Claims, 4 Drawing Sheets

(51) Int. Cl.
 *H01F 41/04* (2006.01)
 *H01F 5/02* (2006.01)
 *H01F 5/06* (2006.01)
 *H01L 39/14* (2006.01)

(52) U.S. Cl.
 CPC ............ *H01F 5/06* (2013.01); *H01F 41/048* (2013.01); *H01L 39/14* (2013.01); *G01R 33/3806* (2013.01)

(58) Field of Classification Search
 CPC ............ G01R 33/4826; G01R 33/4828; G01R 33/483; G01R 33/4831; G01R 33/4833; G01R 33/4835; G01R 33/4836; G01R 33/4838; G01R 33/387; G01R 33/246; G01R 33/389; G01R 33/28
 USPC .................................................. 324/300–322
 See application file for complete search history.

(56) References Cited

U.S. PATENT DOCUMENTS

2016/0322126 A1* 11/2016 Oya .......................... H01F 5/06
2016/0343492 A1* 11/2016 Furukawa ................. H01F 6/06

FOREIGN PATENT DOCUMENTS

| JP | 10-116723 A | 5/1998 |
| JP | 2005-340637 A | 12/2005 |
| JP | 2007-214466 A | 8/2007 |
| JP | 2009-172085 A | 8/2009 |

* cited by examiner

SUPER-CONDUCTING WIRE, SUPER-CONDUCTING COIL, AND MAGNETIC RESONANCE IMAGING DEVICE

TECHNICAL FIELD

The present invention relates to reducing quenches of a super-conducting wire, a super-conducting coil, and a magnetic resonance imaging device (MRI device).

BACKGROUND ART

An output level required of a super-conducting coil that uses a super-conducting wire is increasing year by year, and the electromagnetic force of such a coil is increasing correspondingly. Therefore, there are problems in that shearing stress generated in the super-conducting wire or between members forming the super-conducting coil is increased, which results in the separation of the material covering the super-conducting wire or of the members forming the super-conducting coil, and Joule heat generated upon occurrence of such separation induces a quench. In order to solve such problems, it is necessary to increase the bonding strength of the material covering the super-conducting wire and between the members forming the super-conducting coil so as to prevent the members from separation and thus suppress quenches.

In the conventional art, in order to increase the bonding strength between a winding portion of a super-conducting wire and an insulating plate, for example, ingenuity is exercised by inserting a resin material as a bonding material between the superconductor and the insulating plate, thereby improving the resistance to shearing stress.

CITATION LIST

Patent Literature

Patent Literature 1: JP 2005-340637 A

SUMMARY OF INVENTION

Technical Problem

However, even when the configuration of Patent Literature 1 is adapted, if the shearing stress has increased to a level that is greater than the effect obtained with the increased bonding strength at the interface of the members, there is a possibility that a quench may occur due to Joule heat generated upon occurrence of separation of the members.

Therefore, it is an object of the present invention to provide a super-conducting wire, a super-conducting coil, and an MRI device in which the bonding strength between members is increased than that in the conventional art in order to avoid separation of the members at the interface, which is a cause of a quench.

Solution to Problem

In order to solve the aforementioned problems, a super-conducting coil in accordance with the present invention includes a spool and a super-conducting wire wound around the spool. The super-conducting coil further includes, between the spool and the super-conducting wire, a first resin layer containing thermoplastic resin, a second resin layer containing thermosetting resin, and a mixed layer, the mixed layer being positioned between the first resin layer and the second resin layer and containing a mixture of the thermoplastic resin and the thermosetting resin.

Advantageous Effects of Invention

The present invention can provide a super-conducting wire, a super-conducting coil, and an MRI device in which the bonding strength between members is increased than that in the conventional art and avoid separation of the members at the interface, which is a cause of a quench.

DESCRIPTION OF EMBODIMENTS

Hereinafter, an embodiment of the present invention will be described with reference to the drawings and the like. The following description shows specific examples of the present embodiment. However, the present embodiment is not limited thereto, and a variety of changes and modifications can be made by those skilled in the art within the spirit and scope of the invention disclosed in the specification. In addition, in all drawings illustrating the present embodiment, portions having the same functions are denoted by the same symbols, and the repeated descriptions thereof may be omitted.

Figure 1:
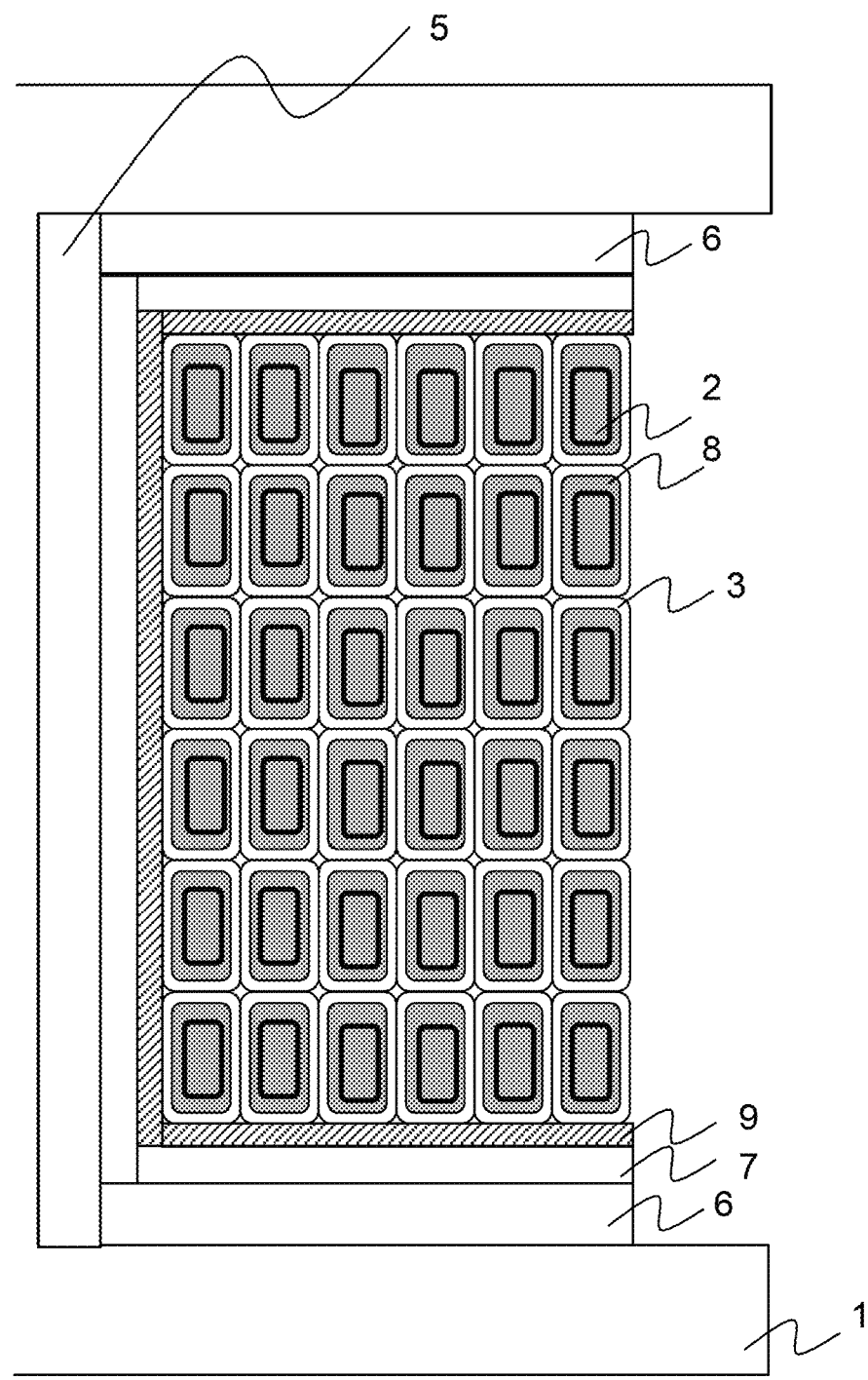
FIG. 1 is a cross-sectional view of a super-conducting coil.
Figure 2:
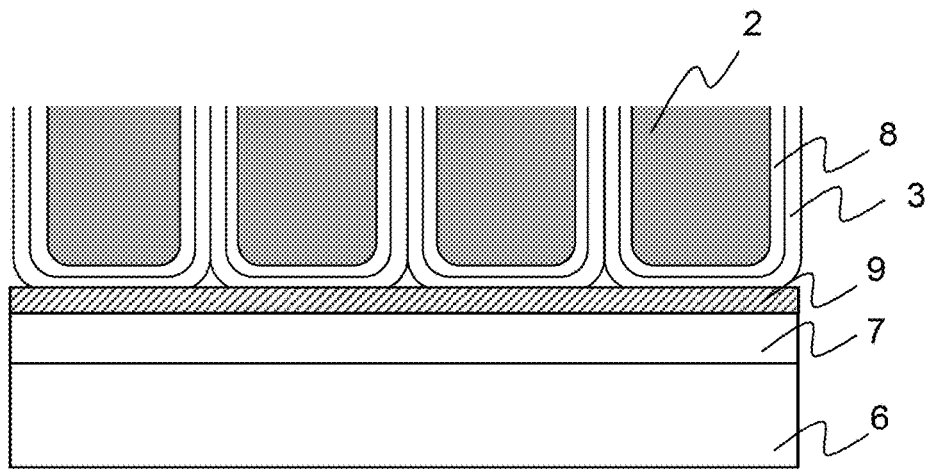
FIG. 2 is an enlarged cross-sectional view of a super-conducting coil.

FIG. 1 is a cross-sectional view of a super-conducting coil in accordance with the present embodiment. FIG. 2 is an enlarged cross-sectional view of a super-conducting wire of the super-conducting coil in FIG. 1. A shown in FIG. 1, the super-conducting coil includes a spool 1 and a super-conducting wire 2 wound around the spool 1, and is formed integrally by a self-fusing layer 3 containing resin for fixing the super-conducting wire 2. For the material of the spool 1, nonmagnetic metal such as stainless steel or aluminum is used. In order to obtain electrical insulation and a heat insulation property, insulating plates 5 and 6 are inserted between the spool 1 and the super-conducting wire 2. Alternatively, a friction material such as fluorine resin may be inserted between the spool 1 and the super-conducting wire 2 to reduce frictional force. Herein, the insulating plate 5 is arranged at a position in contact with the inner peripheral surface of the spool 1, and the insulating plate 6 is arranged at a position in contact with the surface of the spool 1 on the flange side.

The insulating plates 5 and 6 are each formed by stacking a reinforced material containing glass fibers and an insulating material with low thermal conductivity to increase the heat transfer resistance. For the insulating material, polyethylene terephthalate (PET), polyimide, or the like is suitably used as such a material can be easily adjusted in thickness and be impregnated with resin or the like.

An insulating coating 8 is formed on the surface of the super-conducting wire 2, and the self-fusing layer 3 is further provided on the surface of the insulating coating 8. For the insulating coating 8, a coating with a thickness of about 10 to 100 μm, which obtained by applying polyvinyl formal, epoxy, polyimide, polyamide imide, or the like, or further winding thereon fibers of glass, polyester, or the like, is used. For the self-fusing layer 3, a layer with a thickness of about 10 to 100 μm, which is obtained by applying thermoplastic resin such as phenoxy, epoxy, polyamide, polyester, polyimide, or nylon, is used. The heating temperature to cause fusion is set to greater than or equal to 75° C. and less than or equal to 150° C. that are lower than the softening temperature of the insulating coating 8. The thickness is set to a range in which a bonding strength is secured and degradation of thermal conduction does not occur.

Neighboring windings of the super-conducting wire 2 obtained by providing the self-welding layer 3 over the surface of the super-conducting wire 2, which has the insulating coating 8 formed thereon, to be used for a super-conducting coil, are securely fixed together. Therefore, separation of the neighboring windings of the super-conducting wire 2 does not occur and quenches can thus be suppressed. Further, as resin impregnation is not necessary, the number of steps as well as the production time can be significantly reduced.

A prepreg sheet 7, which is obtained by impregnating a stack of a sheet-like glass-reinforced material layer and a sheet-like insulating material layer with resin, is disposed on a curved surface portion of the inner peripheral surface of the super-conducting coil. As the resin for impregnating the prepreg sheet 7, resin, which contains epoxy such as bisphenol A diglycidyl ether (BPADGE) as base resin, contains a curing agent mixed with phthalic anhydride or dicyandiamide, and also contains ethanol or the like as a solvent, is used. The prepreg sheet 7 can be fixed to the members forming the insulating plates 5 and 6 when heated to about 75 to 150° C. Accordingly, the stacked sheets are bonded together and integrated to become a state like fiber-reinforced plastic (FRP). Thus, separation of the members can be prevented.

In order to heat the prepreg sheet 7 to about 75 to 150° C., the entire coil is heated. Therefore, the self-fusing layer 3 softens and then hardens when the temperature is returned to the room temperature, whereby the neighboring windings of the super-conducting coils 2 are fixed together with the self-fusing layer 3. Further, when the coil is heated to about 75 to 150° C., the resin contained in the self-fusing layer 3 is mixed with the resin contained in the prepreg sheet 7, whereby a mixed layer 9 of the self-fusing layer 3 and the prepreg sheet 7 is formed. This is because when pressure is applied between the self-fusing layer 3 and the prepreg sheet 7, the self-fusing layer 3 melts at the interface where the thermoplastic self-fusing layer 3 is in contact with the prepreg sheet 7 containing a thermosetting resin solution at the initial stage when the coil is heated to about 75 to 150° C., whereby the melted self-fusing layer 3 is mixed with the resin solution contained in the prepreg sheet 7. It should be noted that in order to form the mixed layer 9 with an appropriate thickness, the pressure applied between the self-fusing layer 3 and the prepreg sheet 7 is preferably 0.2 to 0.5 MPa, for example. Even when pressure that is less than or greater than such a range is applied, a mixed layer with a given thickness can be formed. However, there is a possibility that the windings of the super-conducting wire may become loose when wound around the spool 1, and in such a case, a sufficient magnetic field for the MRI device to operate may not be obtained. Thus, the pressure is preferably set to 0.2 to 0.5 MPa to obtain a sufficient magnetic field.

It should be noted that each drawing represents the self-fusing layer 3, the mixed layer 9, and the prepreg sheet 7 as if their thicknesses are on the same order of magnitude for the sake of clarity. However, in practice, the thickness of the mixed layer 9 is far smaller than those of the self-fusing layer 3 and the prepreg sheet 7.

Tables 1, 2, and 3 show comparative examples and examples. From the experiments, it was found that the bonding strength between the spool 1 and the super-conducting wire 2 of the super-conducting coil depends on the thickness of the mixed layer 9 and the type of the resin forming the self-fusing layer 3. It should be noted that in Tables 1, 2, and 3, only bisphenol A diglycidyl ether (BPADGE) is exemplarily shown as the resin contained in the prepreg sheet 7. As a result of the experiments, it has been found that the dependency of the bonding strength between the spool 1 and the super-conducting wire 2 of the super-conducting coil on the resin contained in the prepreg sheet 7 is small. Therefore, it is acceptable as long as the resin contained in the prepreg sheet 7 is thermosetting resin that contains epoxy as base resin.

In Comparative Example 1, phenoxy was used as the resin forming the self-fusing layer 3, and bisphenol A diglycidyl ether was used as the resin contained in the prepreg sheet 7. However, the mixed layer 9 was not provided. At that time, the longitudinal shear strength between the spool 1 and the super-conducting wire 2 of the super-conducting coil was found to be 24 MPa. It should be noted that in the present embodiment, the longitudinal shear strength between the spool 1 and the super-conducting wire 2 of the super-conducting coil means the "smallest strength of the longitudinal shear strength between the insulating coating 8 and the self-fusing layer 3, the longitudinal shear strength between the self-fusing layer 3 and the mixed layer 9, the longitudinal shear strength between the mixed layer 9 and the prepreg sheet 7, and the longitudinal shear strength between the prepreg sheet 7 and the insulating plate 5 (insulating plate 6).

In Examples 1-1 to 1-7, phenoxy was used as the resin forming the self-fusing layer 3, and bisphenol A diglycidyl ether was used as the resin contained in the prepreg sheet 7. In each example, the mixed layer 9 with a different thickness was further provided. The longitudinal shear strength between the spool 1 and the super-conducting wire 2 of the super-conducting coil was measured (see Table 1). When the thickness of the mixed layer 9 was set to 10 nm, the longitudinal shear strength was found to be 61 MPa. The thicker the mixed layer 9, the greater the longitudinal shear strength that was obtained.

In Comparative Example 2, nylon was used as the resin forming the self-fusing layer 3, and bisphenol A diglycidyl ether was used as the resin contained in the prepreg sheet 7. However, the mixed layer 9 was not provided. At that time, the longitudinal shear strength between the spool 1 and the super-conducting wire 2 of the super-conducting coil was found to be 21 MPa.

In Examples 2-1 to 2-4, nylon was used as the resin forming the self-fusing layer 3, and bisphenol A diglycidyl ether was used as the resin contained in the prepreg sheet 7. In each example, the mixed layer 9 with a different thickness was further provided. The longitudinal shear strength between the spool 1 and the super-conducting wire 2 of the super-conducting coil was measured (see Table 2). When the thickness of the mixed layer 9 was set to 10 nm, the longitudinal shear strength was found to be 43 MPa. The thicker the mixed layer 9, the greater the longitudinal shear strength that was obtained.

In Comparative Example 3, polyimide was used as the resin forming the self-fusing layer 3, and bisphenol A diglycidyl ether was used as the resin contained in the prepreg sheet 7. However, the mixed layer 9 was not provided. At that time, the longitudinal shear strength between the spool 1 and the super-conducting wire 2 of the super-conducting coil was found to be 5 MPa.

In Examples 3-1 to 3-3, polyimide was used as the resin forming the self-fusing layer 3, and bisphenol A diglycidyl ether was used as the resin contained in the prepreg sheet 7. In each example, the mixed layer 9 with a different thickness was further provided. The longitudinal shear strength between the spool 1 and the super-conducting wire 2 of the super-conducting coil was measured (see Table 3). When the thickness of the mixed layer 9 was set to 10 nm, the longitudinal shear strength was found to be 20 MPa. The thicker the mixed layer 9, the greater the longitudinal shear strength that was obtained.

According to the present method, the mixed layer 9 has a predetermined thickness or more, and the molecules of the resin contained in the self-fusing layer 3 and in the prepreg sheet 7 are mutually entangled with one another, whereby the super-conducting wire 2 is securely bonded to the insulating plates 5 and 6 by the self-fusing layer 3, the prepreg sheet 7, and the mixed layer 9. Accordingly, the super-conducting wire 2 and the insulating plate 5 or the insulating plate 6 in the super-conducting coil can be prevented from separation, and thus, quenches can be significantly reduced.

Regardless of which of phenoxy, nylon, or polyimide is used for the resin forming the self-fusing layer 3, the longitudinal shear strength between the spool 1 and the super-conducting wire 2 of the super-conducting coil is increased as the thickness of the mixed layer 9 is increased. According to the results of the experiments, it was found that as long as the mixed layer 9 is formed to a thickness of at least 10 nm, the longitudinal shear strength is increased by two times or more in comparison with a case where the mixed layer 9 is not provided. It was also found that as long as the mixed layer 9 is formed to a thickness of at least 30 nm, the longitudinal shear strength is increased by three times or more in comparison with a case where the mixed layer 9 is not provided. Further, it was also found that as long as the mixed layer 9 is formed to a thickness of at least 100 nm, the longitudinal shear strength is increased by four times or more in comparison with a case where the mixed layer 9 is not provided. Though not shown in the tables, other types of thermoplastic resin, such as epoxy, polyamide, and polyester, have also been found to have a similar tendency.

Further, when the absolute value of the longitudinal shear strength between the spool 1 and the super-conducting wire 2 of the super-conducting coil is focused, the following analysis is possible.

<Strength A>

(1) When phenoxy was used as the resin forming the self-fusing layer 3 and the thickness of the mixed layer 9 was set to greater than or equal to 10 nm, and (2) when nylon was used as the resin forming the self-fusing layer 3 and the thickness of the mixed layer 9 was set to greater than or equal to 25 nm, the longitudinal shear strength between the spool 1 and the super-conducting wire 2 of the super-conducting coil was found to be greater than or equal to 60 MPa.

<Strength B>

(1) When phenoxy was used as the resin forming the self-fusing layer 3 and the thickness of the mixed layer 9 was set to greater than or equal to 20 nm, and (2) when nylon was used as the resin forming the self-fusing layer 3 and the thickness of the mixed layer 9 was set to greater than or equal to 100 nm, the longitudinal shear strength between the spool 1 and the super-conducting wire 2 of the super-conducting coil was found to be greater than or equal to 80 MPa.

<Strength C>

When phenoxy was used as the resin forming the self-fusing layer 3 and the thickness of the mixed layer 9 was set to greater than or equal to 50 nm, the longitudinal shear strength between the spool 1 and the super-conducting wire 2 of the super-conducting coil was found to be greater than or equal to 100 MPa.

TABLE 1

|   | Comparative Example 1 | Example 1-1 | Example 1-2 | Example 1-3 | Example 1-4 | Example 1-5 | Example 1-6 | Example 1-7 |
|---|---|---|---|---|---|---|---|---|
| Resin forming self-fusing layer | Phenoxy | Phenoxy | Phenoxy | Phenoxy | Phenoxy | Phenoxy | Phenoxy | Phenoxy |
| Resin contained in prepreg sheet | BPADGE | BPADGE | BPADGE | BPADGE | BPADGE | BPADGE | BPADGE | BPADGE |
| Thickness (nm) of mixed layer | — | 10 | 20 | 30 | 50 | 100 | 200 | 300 |
| Longitudinal shear strength (MPa) | 24 | 61 | 82 | 95 | 102 | 110 | 115 | 116 |

TABLE 2

|   | Comparative Example 2 | Example 2-1 | Example 2-2 | Example 2-3 | Example 2-4 |
|---|---|---|---|---|---|
| Resin forming self-fusing layer | Nylon | Nylon | Nylon | Nylon | Nylon |
| Resin contained in prepreg sheet | BPADGE | BPADGE | BPADGE | BPADGE | BPADGE |
| Thickness (nm) of mixed layer | — | 10 | 25 | 100 | 270 |
| Longitudinal shear strength (MPa) | 21 | 43 | 63 | 85 | 88 |

TABLE 3

|  | Comparative Example 3 | Example 3-1 | Example 3-2 | Example 3-3 |
|---|---|---|---|---|
| Resin forming self-fusing layer | Polyimide | Polyimide | Polyimide | Polyimide |
| Resin contained in prepreg sheet | BPADGE | BPADGE | BPADGE | BPADGE |
| Thickness (nm) of mixed layer | — | 10 | 28 | 100 |
| Longitudinal shear strength (MPa) | 5 | 20 | 35 | 40 |

The prepreg sheet 7 has the effect that with the sheet-like member attached, it is possible to form a shape along the inner peripheral surface of the spool 1 and thus obtain a structure without gaps. In addition, combining a plurality of materials as described above can control the bonding strength at the interface of the members as well as control the coefficient of linear expansion and the heat transfer resistance of the members. Therefore, a suitable member with properties that are necessary for a spacer described below can be formed.

Meanwhile, as the insulating plate 5 formed on the flat surface of the spool 1 on the flange side, preformed FRP may also be disposed. For the constituent material of the FRP, a material with properties similar to those of the aforementioned sheet-like member is used.

With the FRP formed with pressure applied thereto as described above, the content of the resin can be adjusted. Further, as formation of voids in the resin can be prevented, the adhesion property improves, a high strength is obtained, and the thickness and the like can be adjusted easily.

Therefore, the properties of the insulating plate can be stabilized. Further, as the handling of the insulating plate during production becomes easy, the assembling steps can be reduced and the cost can also be reduced.

Each of the insulating plates 5 and 6 is preferably formed using an insulating material and a reinforced material such that it has a thermal strain of −0.3 to −0.5% that is ±0.1% with respect to a thermal strain of −0.4% of the super-conducting wire 2.

Typically, the Young's modulus of resin used to impregnate a super-conducting coil is about 10 GPa. Considering the possibility that defects of about 0.1 mm may be present due to failures in impregnation and the like, the strength of the resin is predicted to be about 10 to 20 MPa. Therefore, when a thermal strain of 0.1 to 0.2% is generated between the super-conducting wire 2 and the insulating plate 5 or 6, there is a possibility that cracking of the resin impregnating the super-conducting coil may occur, which in turn may generate heat, or separation of the members may occur during excitation, which in turn may generate heat, and thus resulting in a quench.

Therefore, adjusting the thermal strain of each of the insulating plates 5 and 6 to be within ±0.1% that of the super-conducting wire 2 so as to control the difference in the thermal strain as described above can prevent cracking of the resin impregnating the super-conducting coil and thus suppress generation of heat, which would otherwise cause a quench. For example, when a polyimide film is used as the insulating material, the thermal strains of the glass and the polyimide film that are generated at the room temperature to ultralow temperatures are −0.15% and −0.6%, respectively. Accordingly, the ratio between the glass and the polyimide film is determined. That is, the ratio of the polyimide film to the glass (which is assumed to be 1 herein) is greater than or equal to 0.5 and less than or equal to 3.5.

According to the aforementioned structure, the super-conducting wire 2 will deform while being integrated with the insulating plates 5 and 6 even when the super-conducting coil is cooled. Thus, generation of heat from the superconductor can be avoided.

The magnetic field strength of the super-conducting coil will differ depending on the shape, size, or structure of the coil. In the present structure, the super-conducting coil is preferably used at a strength of less than or equal to that of the self-fusing layer 3 because the neighboring windings of the super-conducting wire are fixed together with the self-fusing layer 3.

The strength of the self-fusing layer 3 is typically about 100 to 200 MPa. Therefore, the super-conducting coil is designed with the conditions of a lower strength than that.

Considering that a safety factor of ×2 should be used, a strength of less than or equal to 50 MPs would be appropriate. Even when the super-conducting coil is used under more severe conditions, it is not realistic to use the coil at a strength of greater than or equal to 100 MPa. Therefore, the upper limit is considered to be about 100 MPa.

As the heat transfer resistance of each of the insulating plates 5 and 6 is increased, the amount of heat transfer becomes small. Therefore, when the super-conducting coil is used in a high magnetic field, the heat transfer resistance of the insulating material used for the super-conducting coil should be increased. However, if the insulating material is increased too much, the rigidity of the entire coil becomes small and the cost can also increase. Therefore, appropriate insulation resistance should be set in accordance with a magnetic field. When heat is generated due to separation of the members forming the spool 1 and the insulating plate 5 or 6, the generated heat is transferred to the spool 1 and the insulating plate 5 or 6. However, the amount of heat transferred is determined by the heat transfer resistance of each member.

The spool 1 is typically and often produced using stainless steel. Therefore, such a structure of the spool 1 is described below.

The relationship between the heat transfer resistance and the heat input limit of each of the insulating plates 5 and 6 when its thickness is changed is substantially linear. It is preferred to estimate the amount of heat generation on the basis of the specifications of the coil and set the heat transfer resistance accordingly. When a magnetic field is increased, the temperature tolerance of the wire rod is decreased. Therefore, heat transfer resistance is determined taking such a property into consideration.

When the self-fusing layer 3 with a high bonding strength, the prepreg sheet 7, and the insulating plates 5 and 6 with sufficiently high heat transfer resistance and thus with adjusted thermal strains are inserted at a portion between the members forming the super-conducting wire 2 and the spool 1, which may otherwise separate, even a super-conducting coil with a large load that generates a high magnetic field can be used in a stable state.

Such a super-conducting coil is entirely immersed in a liquid at an ultralow temperature, such as liquid helium, in order to maintain the super-conducting wire 2 at a temperature of less than or equal to the superconductive transition temperature. The super-conducting coil cooled in such a manner becomes a super-conducting state, and generates a magnetic field with a current is flowed therethrough.

As described above, at an ultralow temperature, the specific heat of each member becomes small. Therefore, there is a possibility that a quench may occur where the super-conducting coil transitions from the super-conducting state to the normal conducting state in response to even a small amount of heat generation.

Examples of a cause of a quench in a super-conducting coil at an ultralow temperature include mechanical disturbance. When mechanical disturbance, such as cracking of resin impregnating the super-conducting coil, separation of the members forming the super-conducting coil, or separation of members due to displacement of a member forming the super-conducting coil with respect to a member around the super-conducting coil, occurs, heat is generated accordingly, resulting in a quench.

Such cracking of resin or separation of members is considered to occur because, when the super-conducting coil is cooled, the members forming the super-conducting coil undergo heat shrinkage, but as the shrinkage factor of each member is different, the self-fusing layer 3 cracks due to thermal stress, which in turn causes separation of the members, and further, when an electromagnetic force is received during excitation, the separation further progresses, which can result in the relative displacement between the members.

It should be noted that as a measure against an electromagnetic force that may be received when the super-conducting wire 2 is wound around the spool 1, it is possible to adopt a method of winding the super-conducting wire 2, which has been pulled to create tension, around the spool 1 in a state in which a tension of greater than or equal to a constant level is applied to the super-conducting wire 2 in advance so as to prevent slippery thereof with respect to the spool 1.

FIG. 2 is an enlarged cross-sectional view of a super-conducting coil that uses a rectangular wire. The super-conducting coil in FIG. 2, which is a partially enlarged view of the super-conducting coil in FIG. 1, includes the super-conducting wire 2, the self-fusing layer 3, the insulating coating 8, the insulating plate 6, the prepreg sheet 7, and the mixed layer 9.

Figure 3:
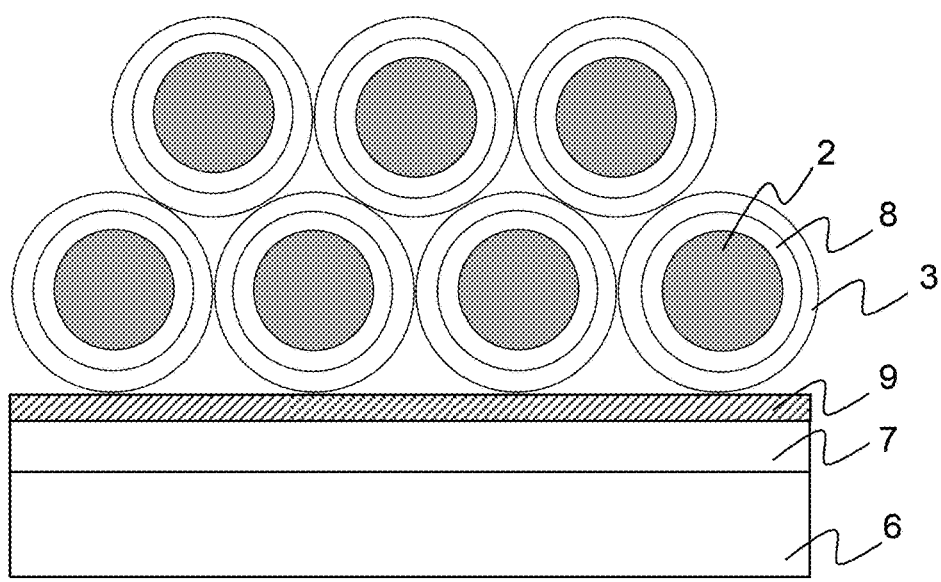
FIG. 3 is an enlarged cross-sectional view of a super-conducting coil when a round wire is used.

FIG. 3 is an enlarged cross-sectional view of a super-conducting coil that uses a round wire. The super-conducting coil includes the super-conducting wire 2, the insulating coating 8, the self-fusing layer 3, the mixed layer 9, the prepreg sheet 7, and the insulating plate 6 as in the case where a rectangular wire is used as shown in FIG. 2.

MRI devices come in two types that are an open type and a tunnel type. When the super-conducting coil in this embodiment is used, generation of quenches can be suppressed in both types of MRI devices. In particular, in the open type, as a super-conducting coil is disposed on each of the top and bottom sides, shearing stress that acts with a magnetic field applied to the super-conducting coil is larger than that in the tunnel type in which a coil is arranged in a cylindrical form. Therefore, there is an increased possibility of generation of quenches due to Joule heat generated upon occurrence of separation of the members forming the super-conducting coils or cracking of resin. Thus, the advantageous effect of the present embodiment that is capable of suppressing generation of quenches with an improved bonding force is high. When the present embodiment is adopted, it is possible to reduce the rate of generation of quenches in a MRI device to less than 1%.

A magnetic resonance imaging device (hereinafter, MRI device) will be described with reference to FIG. 4.

An MRI device 20 includes a pair of static magnetic field generation portions 21 and coupling members 22 that are coupled to each other such that the central axis Z pointing the perpendicular direction becomes the symmetry axis of rotation. A space formed by the pair of static magnetic field generation portions 21 and the coupling members 22 is referred to as an imaging region 23. Gradient magnetic field generation portions 24 are present such that they sandwich the imaging region 23 therebetween. In addition, the MRI device 20 includes a bed 26 on which a test subject 25 is laid and a transporter 27 that transports the test subject 25 on the bed 26 to the imaging region 23.

The pair of static magnetic field generation portions 21 each includes the super-conducting coil described in Example 1. With the super-conducting coil, a static magnetic field is generated.

Figure 4:
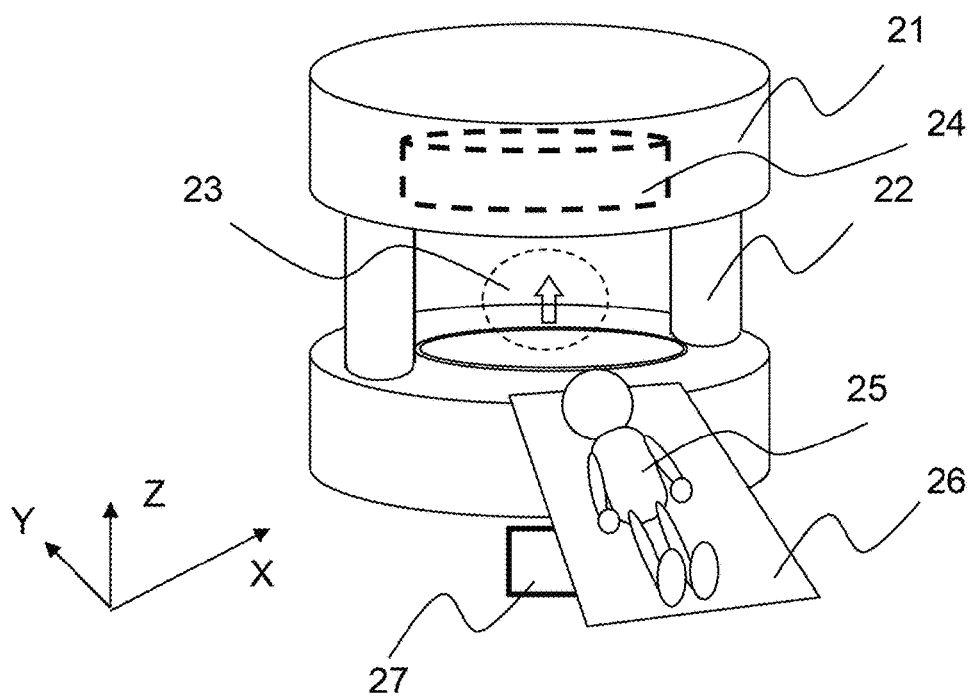
FIG. 4 is an overall perspective view of an MRI device.

Further, the MRI device 20 includes, as other components that are not represented in the overall perspective view of FIG. 4, an RF (radio frequency) oscillation portion 28 that irradiates the imaging region 23 with an electromagnetic wave with a resonance frequency that allows a NMR phenomenon to occur in the test subject 25; a receiving coil 29 that receives a response signal emitted in response to a change in the spin state of the hydrogen nucleus upon occurrence of the NMR phenomenon; a control unit 30 that controls each unit of the MRI device 10; and an analyzer 31 that processes the received signal and analyzes it.

The static magnetic field generation portions 21 are each adapted to generate a uniform static magnetic field (uniform magnetic field) in the imaging region 23, and the gradient magnetic field generation portions 24 are each adapted to superimpose a gradient magnetic field on the uniform magnetic field so that the magnetic field strength in the imaging region 23 becomes sloped. With such a configuration, the MRI device 20 is adapted to allow an NMR phenomenon to occur only in the region of interest (typically, a sliced plane with a thickness of 1 mm), thereby forming a tomographic image of the test subject 25.

The gradient magnetic field generation portions 24 are disposed in a pair of housing spaces that are provided on opposed surfaces of the pair of static magnetic field generation portions 21. The gradient magnetic field generation portions 24 are each adapted to change as appropriate the magnetic field strength with respect to three perpendicular directions of the imaging region 23 during operation of the MRI device 20, thereby superimposing a gradient magnetic field on the uniform static magnetic field. As the magnetic field strength in the imaging region 23 is changed as appropriate with respect to the three perpendicular directions and thus becomes sloped, a three dimensional position at which a NMR phenomenon occurs is clarified.

Although a vertical magnetic field MRI device has been exemplarily described, the configuration of the present embodiment can be used for even a horizontal magnetic field MRI device that is not shown.

Figure 5:
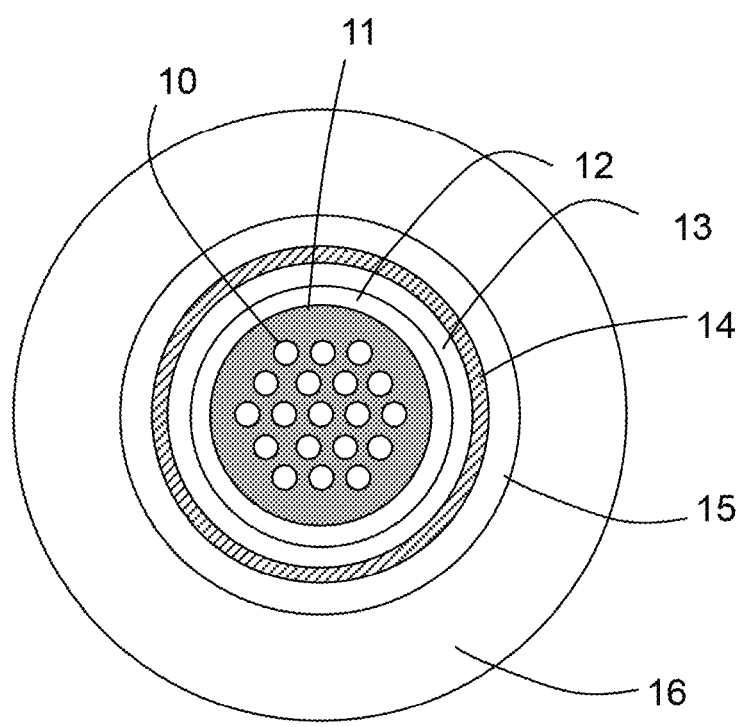
FIG. 5 is a cross-sectional view of a super-conducting wire.

FIG. 5 is a cross-sectional view of a super-conducting wire. As shown in FIG. 5, the super-conducting wire includes a super-conducting raw material 10, a metal sheath 11, an insulating coating 12 covering the metal sheath 11, a self-fusing layer 13, a mixed layer 14 of resin, a prepreg sheet 15, and an insulator 16.

A super-conducting coil has been mainly described as an invention with reference to FIGS. 1 to 3. Hereinafter, an invention will be described as a "super-conducting wire that includes the self-fusing layer 13, the mixed layer 14 of resin, and the prepreg sheet 15" with reference to FIG. 4.

A metal sheath super-conducting wire in this embodiment has a structure in which at least one super-conducting raw material 10 is embedded in the filament state in the metal sheath 11. The super-conducting wire rod may be in any of a round shape, a rectangular shape, a tape shape, or a combined shape obtained by twisting such round wires.

The super-conducting raw material 10 can be selected from a wide range of materials, such as NbTi, $MgB_2$, an oxide superconductor, and an organic superconductor.

For the metal sheath 11, specifically, a metal tube of pure Fe, pure Ni, pure Cu, or the like is preferably used. The insulating coating 12 is formed on the surface of the metal sheath 11, and further, the self-fusing layer 13 is provided on the surface of the insulating coating 12. For the insulating coating 12, a coating with a thickness of about 10 to 100 μm, which obtained by applying polyvinyl formal, epoxy, polyimide, polyamide imide, or the like, or further winding thereon fibers of glass, polyester, or the like, is used. For the self-fusing layer 13, a layer with a thickness of about 10 to 100 μm, which is obtained by applying thermoplastic resin such as phenoxy, epoxy, polyamide, polyester, polyimide, or nylon, is used. The heating temperature to cause fusion is set to greater than or equal to 75° C. and less than or equal to 150° C. that are lower than the softening temperature of the insulating coating 8. The thickness is set to a range in which a bonding strength is secured and degradation of thermal conduction does not occur.

As the resin for impregnating the prepreg sheet 15 formed on the outer side of the self-fusing layer 13, resin that contains epoxy such as bisphenol A diglycidyl ether as base resin, contains a curing agent mixed with phthalic anhydride or dicyandiamide, and also contains ethanol or the like as a solvent, is used. When the entire super-conducting wire is heated to about 75 to 150° C., the prepreg sheet 15 can be fixed to the insulator 16 formed on the outer side of the prepreg sheet 15. Accordingly, the stacked sheets are bonded together and integrated to become a state like fiber-reinforced plastic (FRP). Thus, the members can be prevented from separation.

The insulator 16 formed on the outer side of the prepreg sheet 15 is obtained by stacking a reinforced material containing glass fibers and an insulating material with low thermal conductivity to increase the heat transfer resistance. For the insulating material, polyethylene terephthalate (PET), polyimide, or the like is suitably used as such a material can be easily adjusted in thickness and be impregnated with resin or the like.

When the entire super-conducting wire is heated to about 75 to 150° C., the resin contained in the self-fusing layer 13 is mixed with the resin contained in the prepreg sheet 15, whereby a mixed layer 14 of the self-fusing layer 13 and the prepreg sheet 15 is formed. This is because the self-fusing layer 13 melts at the interface where the thermoplastic self-fusing layer 13 is in contact with the prepreg sheet 15 containing a thermosetting resin solution at the initial stage when the super-conducting wire is heated to about 75 to 150° C., whereby the melted self-fusing layer 13 is mixed with the resin solution contained in the prepreg sheet 15.

According to the present method, the mixed layer 14 has a predetermined thickness or more, and the molecules of the resin contained in the self-fusing layer 13 and in the prepreg sheet 15 are mutually entangled with one another, whereby the metal sheath 11 and the insulator 16 are securely bonded together with the self-fusing layer 13, the prepreg sheet 15, and the mixed layer 14 of the resin thereof. Accordingly, the metal sheath 11 and the insulator 16 in the super-conducting wire can be prevented from separation, and thus, quenches can be significantly reduced.

REFERENCE SIGNS LIST

1 Spool
2 Super-conducting wire
3 Self-fusing layer
5 Insulating plate
6 Insulating plate
7 Prepreg sheet
8 Insulating coating
9 Mixed layer
10 Super-conducting raw material
11 Metal sheath
12 Insulating coating
13 Self-fusing layer
14 Mixed layer
15 Prepreg sheet
16 Insulator
20 MRI device
21 Pair of static magnetic field generation portions
22 Coupling member
23 Imaging region
24 Gradient magnetic field generation portion
25 Test subject
26 Bed
27 Transporter
28 RF oscillation portion
29 Receiving coil
30 Control unit
31 Analyzer

The invention claimed is:

1. A super-conducting coil comprising a spool and a super-conducting wire wound around the spool, wherein the coil further comprises, between the spool and the super-conducting wire, a first resin layer containing thermoplastic resin, wherein the first resin layer surrounds an outer periphery of the super-conducting wire, a second resin layer containing thermosetting resin, wherein the second resin layer is disposed on a curved surface portion of an inner peripheral surface of the super-conducting coil, and a mixed layer, the mixed layer being positioned between the first resin layer and the second resin layer and containing a mixture of the thermoplastic resin and the thermosetting resin.

2. The super-conducting coil according to claim 1, wherein a thickness of the mixed layer is greater than or equal to 10 nm.

3. The super-conducting coil according to claim 1, wherein a thickness of the mixed layer is greater than or equal to 30 nm.

4. The super-conducting coil according to claim 1, wherein a thickness of the mixed layer is greater than or equal to 100 nm.

5. The super-conducting coil according to claim 1, wherein
the thermoplastic resin is phenoxy, and
a thickness of the mixed layer is greater than or equal to 10 nm.

6. The super-conducting coil according to claim 1, wherein
the thermoplastic resin is phenoxy, and
a thickness of the mixed layer is greater than or equal to 20 nm.

7. The super-conducting coil according to claim 1, wherein
the thermoplastic resin is phenoxy, and
a thickness of the mixed layer is greater than or equal to 50 nm.

8. The super-conducting coil according to claim 1, wherein
the thermoplastic resin is nylon, and
a thickness of the mixed layer is greater than or equal to 25 nm.

9. The super-conducting coil according to claim 1, wherein
the thermoplastic resin is nylon, and
a thickness of the mixed layer is greater than or equal to 100 nm.

10. The super-conducting coil according to claim 1, wherein the first resin layer has a self-fusing property.

11. The super-conducting coil according to claim 1, wherein the second resin layer is a prepreg sheet.

12. The super-conducting coil according to claim 1, further comprising an insulating coating disposed upon the super-conducting wire and an insulating plate disposed between the spool and the super-conducting wire, wherein the super-conducting wire, the insulating coating, the first resin layer, the mixed layer, the second resin layer, the insulating plate, and the spool are sequentially formed in this order.

13. A magnetic resonance imaging device comprising:
the super-conducting coil according to claim 1;
a bed on which a test subject is laid;
a transporter configured to transport the test subject laid on the bed to an imaging region; and
an analyzer configured to analyze a nuclear magnetic resonance signal from the test subject transported to the imaging region by the transporter.

14. A method for producing a super-conducting coil including a spool and a super-conducting wire wound around the spool, the method comprising the steps of, between the spool and the super-conducting wire, forming a first resin layer containing thermoplastic resin, wherein the first resin layer surrounds an outer periphery of the super-conducting wire, forming a second resin layer containing thermosetting resin, wherein the second resin layer is disposed on a curved surface portion of an inner peripheral surface of the super-conducting coil, and forming a mixed layer, the mixed layer being positioned between the first resin layer and the second resin layer and containing a mixture of the thermoplastic resin and the thermosetting resin.

15. The method for producing a super-conducting coil according to claim 14, wherein a thickness of the mixed layer is greater than or equal to 10 nm.

16. The method for producing a super-conducting coil according to claim 14, further comprising a step of applying a pressure of 0.2 to 0.5 MPa between the first resin layer and the second resin layer in the step of forming the mixed layer.

17. A super-conducting wire comprising a metal tube and a superconductor housed in the metal tube, wherein the super-conducting wire further comprises, on a surface of the metal tube, a first resin layer containing thermoplastic resin, wherein the first resin layer surrounds an outer periphery of the super-conducting wire, a second resin layer containing thermosetting resin, and a mixed layer, wherein the second resin layer is disposed on a curved surface portion of an inner peripheral surface of the super-conducting coil, the mixed layer being positioned between the first resin layer and the second resin layer and containing a mixture of the thermoplastic resin and the thermosetting resin.

* * * * *